(12) United States Patent
Nakamura et al.

(10) Patent No.: US 11,116,080 B2
(45) Date of Patent: Sep. 7, 2021

(54) WIRING SUBSTRATE

(71) Applicant: IBIDEN CO., LTD., Ogaki (JP)

(72) Inventors: Takenobu Nakamura, Ogaki (JP);
Takahiro Yamazaki, Ogaki (JP);
Takashi Yamauchi, Ogaki (JP);
Toshihide Makino, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 16/830,507

(22) Filed: Mar. 26, 2020

(65) Prior Publication Data

US 2020/0315009 A1 Oct. 1, 2020

(30) Foreign Application Priority Data

Mar. 27, 2019 (JP) .............................. JP2019-061837

(51) Int. Cl.
| | |
|---|---|
| *H05K 1/11* | (2006.01) |
| *H05K 1/02* | (2006.01) |
| *H05K 1/03* | (2006.01) |

(52) U.S. Cl.
CPC ........... *H05K 1/112* (2013.01); *H05K 1/0271* (2013.01); *H05K 1/0366* (2013.01); *H05K 1/0373* (2013.01); *H05K 2201/096* (2013.01); *H05K 2201/09827* (2013.01)

(58) Field of Classification Search
CPC ................. H05K 1/112; H05K 1/0271; H05K 2201/096; H05K 2201/09827
See application file for complete search history.

(56) References Cited

U.S. PATENT DOCUMENTS

| | | | | |
|---|---|---|---|---|
| 9,326,377 | B2* | 4/2016 | Morita | ................. H05K 1/0306 |
| 2010/0065318 | A1* | 3/2010 | Nagasawa | .............. H05K 1/115 |
| | | | | 174/260 |
| 2014/0166355 | A1* | 6/2014 | Hong | ..................... H05K 3/426 |
| | | | | 174/264 |
| 2016/0135289 | A1* | 5/2016 | Cho | ..................... H05K 1/0271 |
| | | | | 174/251 |

(Continued)

FOREIGN PATENT DOCUMENTS

JP 2014-154631 A 8/2014

*Primary Examiner* — Ishwarbhai B Patel
(74) *Attorney, Agent, or Firm* — Oblon, McClelland, Maier & Neustadt, L.L.P.

(57) ABSTRACT

A wiring substrate includes a core layer, first conductor layers including first inner, outer and intermediate layers, second conductor layers including second inner, outer and intermediate layers, interlayer insulating layers interposed between the first conductor layers and between the second conductor layers, and via conductors formed in the insulating layers such that each via conductor connects two conductor layers and is integrally formed with one of the conductor layers on side away from the core layer. The first and/or second inner conductor layers has a first conductor layer structure including metal foil and plating film layers, the first and/or second outer conductor layers has the first structure, the first and/or second intermediate conductor layers has a second conductor layer structure including metal foil and plating film layers, and the via conductors include a group integrally formed with the first structure and including constricted via conductors each having a constricted portion.

20 Claims, 9 Drawing Sheets

(56) References Cited

U.S. PATENT DOCUMENTS

2016/0192490 A1\* 6/2016 Kang .................... H05K 1/0346
                                                          174/258
2016/0330836 A1\* 11/2016 Mizutani ................ H05K 3/187
2018/0042124 A1\* 2/2018 Makino ................ H05K 3/4652

\* cited by examiner

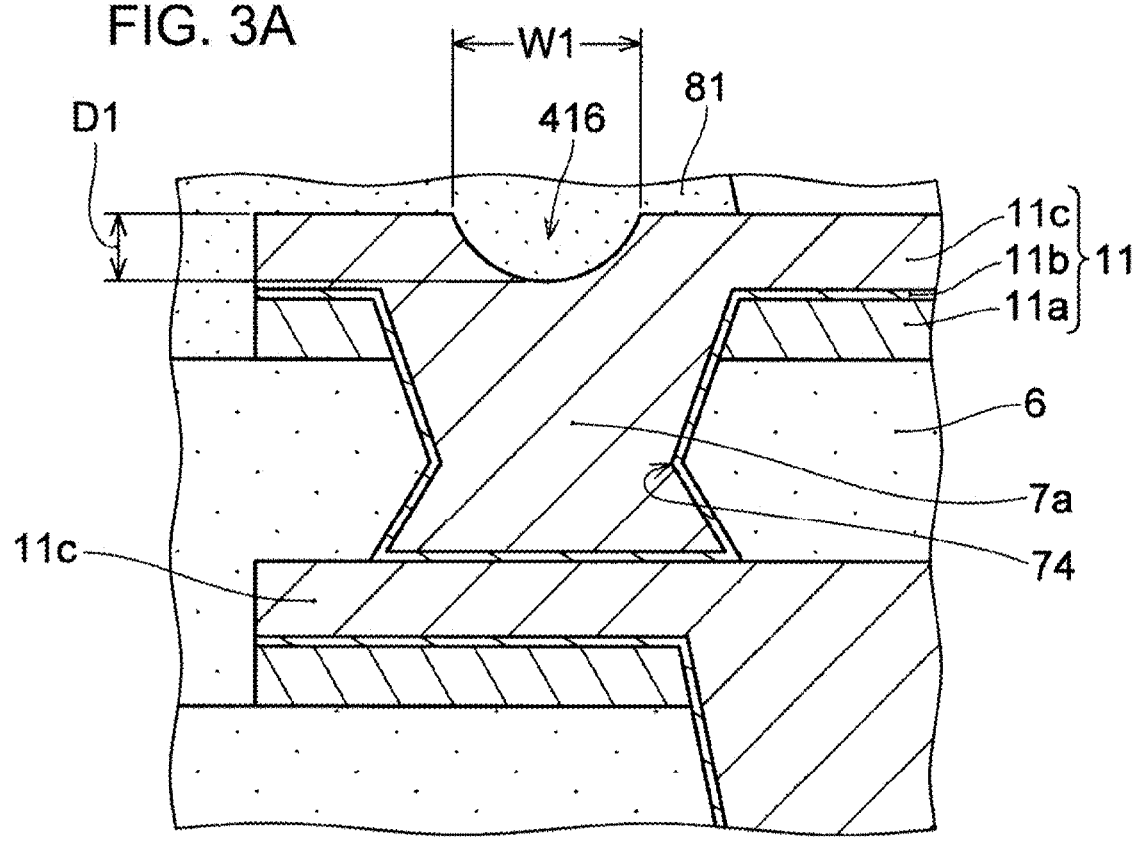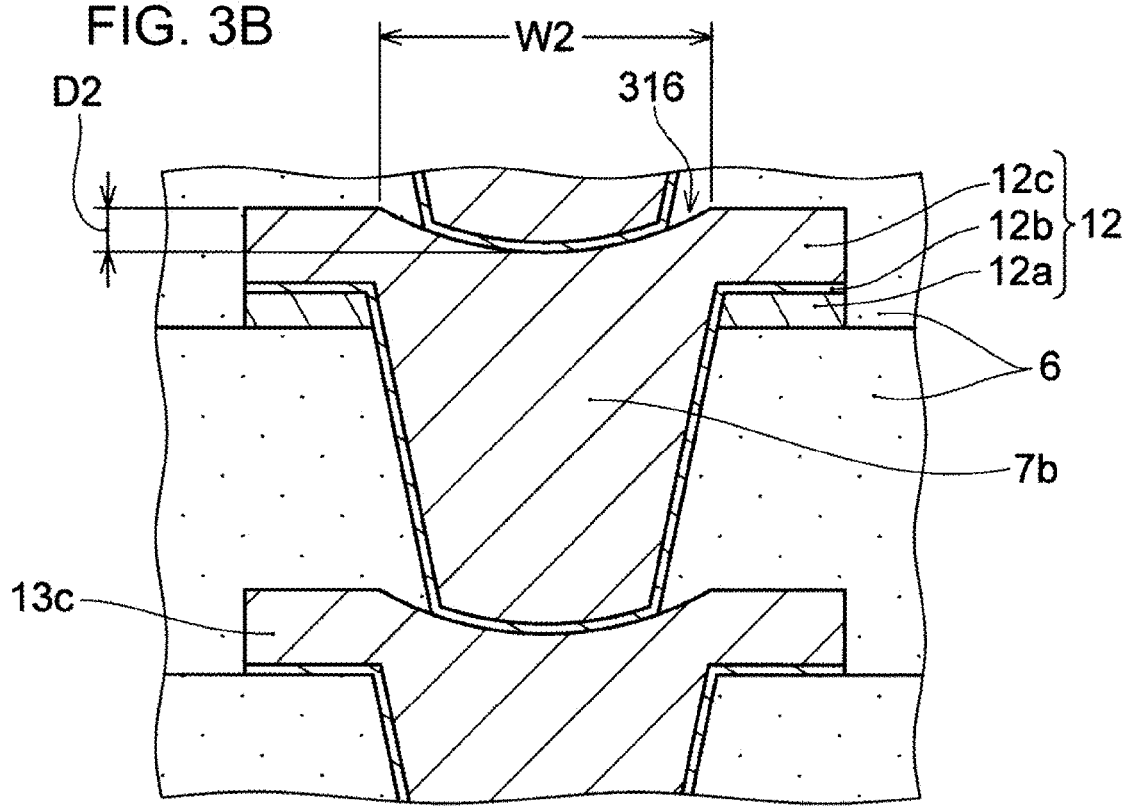

WIRING SUBSTRATE

CROSS-REFERENCE TO RELATED APPLICATIONS

The present application is based upon and claims the benefit of priority to Japanese Patent Application No. 2019-061837, filed Mar. 27, 2019, the entire contents of which are incorporated herein by reference.

BACKGROUND OF THE INVENTION

Field of the Invention

The present invention relates to a wiring substrate.

Description of Background Art

Japanese Patent Application Laid-Open Publication No. 2014-154631 describes a multilayer wiring board in which multiple interlayer resin insulating layers and multiple wiring pattern layers are laminated, and patterns of adjacent wiring pattern layers are connected to each other by via holes. The wiring pattern layers are formed together with the via holes by electroless plating and electrolytic plating. The entire contents of this publication are incorporated herein by reference.

SUMMARY OF THE INVENTION

According to one aspect of the present invention, a wiring substrate includes a core layer, first conductor layers formed on a first surface of the core layer and including a first inner conductor layer formed on the first surface of the core layer, a first outer conductor layer forming an outermost conductor layer on a first surface side of the core layer, and a first intermediate conductor layer formed between the first inner conductor layer and the first outer conductor layer, second conductor layers formed on a second surface of the core layer on the opposite side with respect to the first surface of the core layer and including a second inner conductor layer formed on the second surface of the core layer, a second outer conductor layer forming an outermost conductor layer on a second surface side of the core layer, and a second intermediate conductor layer formed between the second inner conductor layer and the second outer conductor layer, interlayer insulating layers interposed between the first inner conductor layer and the first intermediate conductor layer, between the second inner conductor layer and the second intermediate conductor layer, between the first intermediate conductor layer and the first outer conductor layer, and between the second intermediate conductor layer and the second outer conductor layer, and via conductors formed in the interlayer insulating layers such that each of the via conductors connects two conductor layers in one of the first and second conductor layers through one of the interlayer insulating layers and is integrally formed with one of the two conductor layers on a side away from the core layer. At least one of the first and second inner conductor layers has a first conductor layer structure including a metal foil layer and a plating film layer, at least one of the first and second outer conductor layers has the first conductor layer structure, at least one of the first and second intermediate conductor layers has a second conductor layer structure including a metal foil layer and a plating film layer, and the via conductors include a first group of via conductors integrally formed with the first conductor layer structure such that the first group of via conductors includes constricted via conductors each of which has a constricted portion between the two conductor layers being connected thereby.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 3A is an enlarged view of a portion (IIIA) in FIG. 1, and is a cross-sectional view describing a first recess formed in the first conductor layer;

FIG. 3B is an enlarged view of a portion (MB) in FIG. 1, and is a cross-sectional view describing a second recess formed in the second conductor layer;

DETAILED DESCRIPTION OF THE EMBODIMENTS

Figure 1:
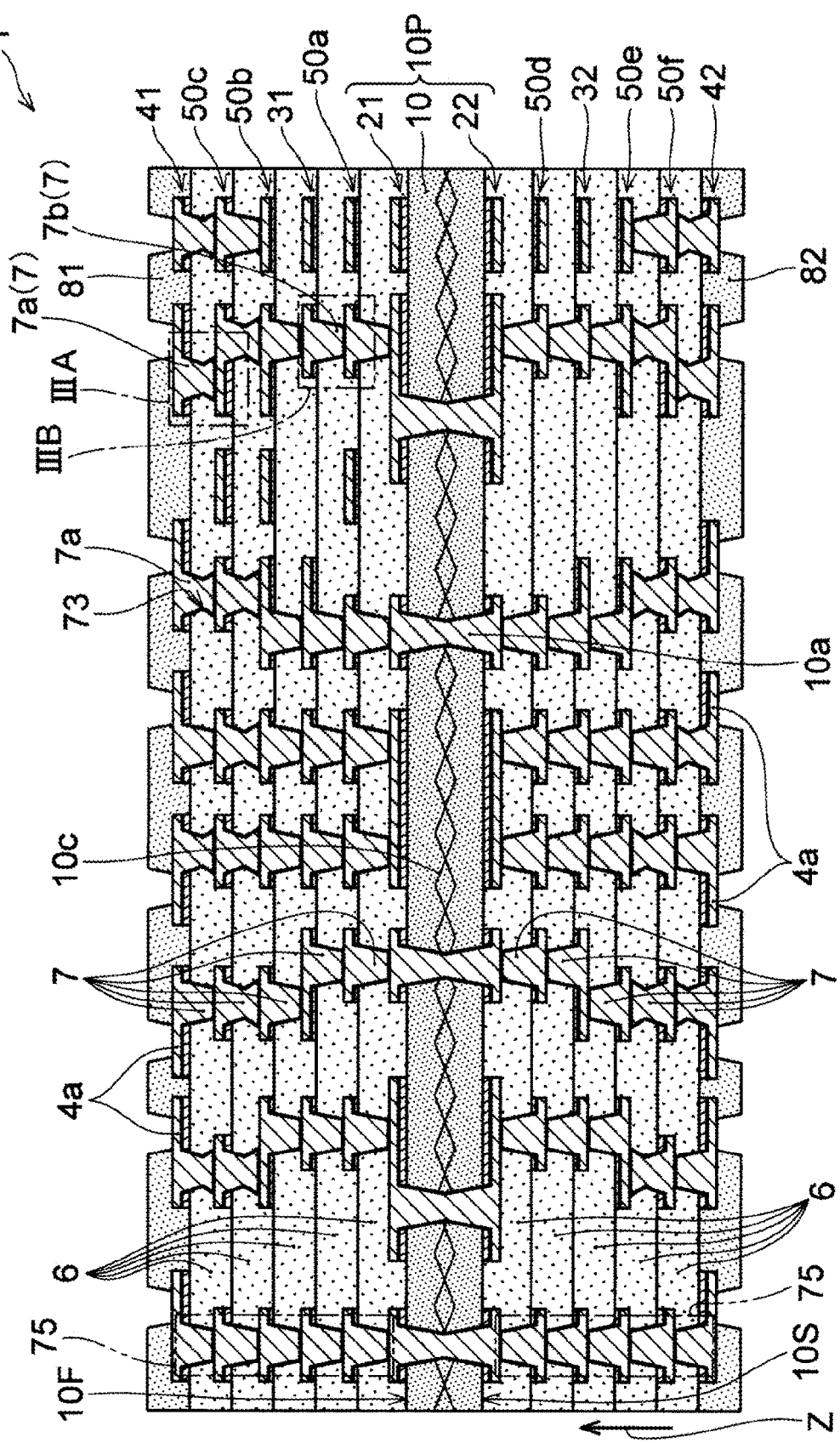
FIG. 1 is a cross-sectional view illustrating an example of a wiring substrate of an embodiment of the present invention.

Embodiments will now be described with reference to the accompanying drawings, wherein like reference numerals designate corresponding or identical elements throughout the various drawings.

Next, a wiring substrate of an embodiment of the present invention is described with reference to the drawings. FIG.

1 illustrates a cross-sectional view of a wiring substrate 1 which is an example of the wiring substrate of the embodiment. As illustrated in FIG. 1, the wiring substrate 1 includes a core layer 10 having a first surface (10F) and a second surface (10S) on an opposite side with respect to the first surface (10F), a first inner conductor layer 21 formed on the first surface (10F) of the core layer 10, and a second inner conductor layer 22 formed on the second surface (10S) of the core layer 10. The core layer 10 is formed using an insulating material. The core layer 10 and the first and second inner conductor layers (21, 22) form a core substrate (10P). First inner-layer conductor layers (50a, 50b, 50c), a first intermediate conductor layer 31, second inner-layer conductor layers (50d, 50e, 50f), a second intermediate conductor layer 32, and interlayer insulating layers 6 are formed on a first surface (10F) side and a second surface (10S) side of the core substrate (10P). The wiring substrate 1 further includes a first outer conductor layer 41 formed on an outermost layer on the first surface (10F) side of the core layer 10, and a second outer conductor layer 42 formed on an outermost layer on the second surface (10S) side of the core layer 10. The interlayer insulating layers 6 are respectively provided between the conductor layers to provide insulation between the conductor layers. Further, in each of the interlayer insulating layers 6, via conductors 7 are formed that connect to each other conductor layers that are respectively arranged on both sides of the each of the interlayer insulating layers 6 and are integrally formed with the conductor layer on an opposite side with the core layer 10.

Figure 2A:
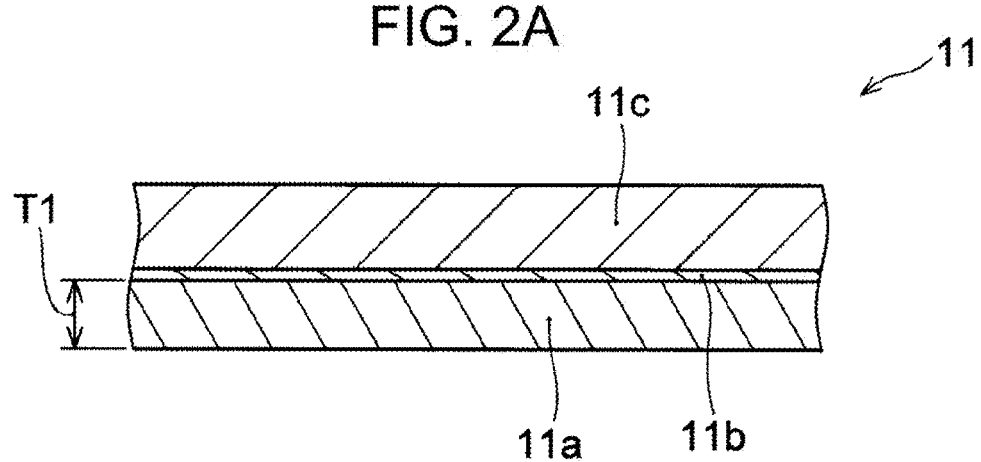
FIG. 2A is an enlarged view of a first conductor layer having a first laminated structure of conductor layers illustrated in FIG. 1.
Figure 2B:
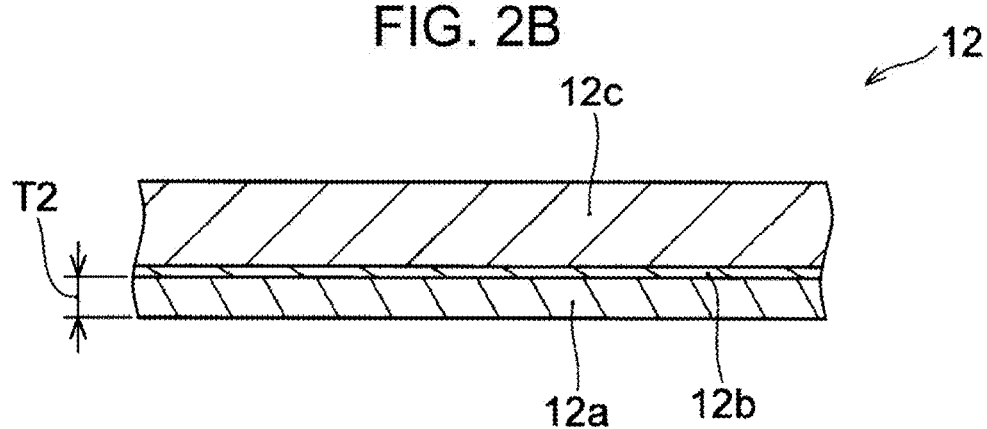
FIG. 2B is an enlarged view of a second conductor layer having a second laminated structure of conductor layers illustrated in FIG. 1.

In the present embodiment, in the example illustrated in FIG. 1, the first inner conductor layer 21, the second inner conductor layer 22, the first outer conductor layer 41 and the second outer conductor layer 42 are each formed of a first conductor layer 11 having a first laminated structure that, as illustrated in FIG. 2A, includes at least a metal foil layer (11a) and a plating film layer (11c), the metal foil layer (11a) having a predetermined thickness (T1). However, it is not necessary that both each of the inner conductor layers (21, 22) and each of the outer conductor layers (41, 42) are each formed of the first conductor layer 11, and it is sufficient that one of the two is formed of the first conductor layer 11. The first intermediate conductor layer 31 and the second intermediate conductor layer 32 are each formed of a second conductor layer 12 having a second laminated structure that, as illustrated in FIG. 2B, includes at least a metal foil layer (12a) and a plating film layer (12c), the metal foil layer (12a) having a thickness (T2) smaller than the predetermined thickness (T1). Then, a first group of via conductors 7 integrally formed with the first conductor layer 11 (see FIG. 3A) (for example, via conductors 7 integrally formed with the first outer conductor layer 41) includes constricted via conductors (7a) that each have a constricted portion 74 (see FIGS. 1 and 3A) on the side of the conductor layer (for example, the inner-layer conductor layer (50c)) (on the core layer 10 side) connected to this group of via conductors 7. Here, "a group of via conductors" means all via conductors 7 that are integrally formed with a specific conductor layer.

The via conductors 7 and the conductor layers integrally formed with the via conductors 7 are so-called filled vias formed by filling through holes penetrating the interlayer insulating layers 6 with conductors. Each of the via conductors 7 is integrally formed with a conductor layer on an upper side thereof. For example, the constricted via conductors (7a) formed directly below the first outer conductor layer 41 are formed together and integrally with the first outer conductor layer 41. The via conductors 7 are each formed by, for example, an electroless plating film and an electrolytic plating film of copper, nickel, or the like. The conductors can be formed using various methods such as electrolytic plating, sputtering, and vacuum deposition. However, electrolytic plating is often used due to simplicity in equipment.

As illustrated in the enlarged views of FIGS. 3A and 3B, when the via conductors 7 (including both constricted via conductors (7a) and non-constricted via conductors (7b)) have different shapes, recesses (first recesses 416 and second recesses 316) formed on upper surfaces (surfaces on an opposite side with respect to the core layer 10) of the conductor layers (11, 12) thereabove have different shapes. The via conductors 7 integrally formed with the first and second outer conductor layers (41, 42) include constricted via conductors (7a) each having a structure that has a constricted portion 74. In the case of such a constricted via conductor (7a) having a restricted portion 74, a steep first recess 416 is likely to be formed on a surface (on an opposite side with respect to the core layer 10) of the conductor layer integrally formed with this constricted via conductor (7a).

Figure 9:
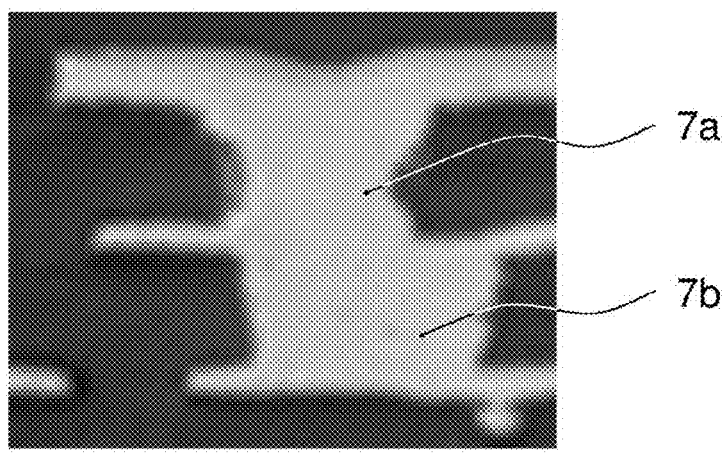
FIG. 9 shows a photographs of a cross section of a constrained via conductor and a non-constrained via conductor illustrated in FIGS. 3A and 3B, in which an upper part shows the constrained via conductor and a lower part shows the non-constrained via conductor.

It is thought that the difference in the shapes of the via conductors 7 may be due to differences in shapes and volumes of holes 71 (see FIG. 4A) formed in the interlayer insulating layers 6. Details thereof will be described later. The difference in the shapes of the holes 71 can be attributed to various factors. However, one factor is the difference in the laminated structures of the conductor layers, that is, the laminated structures of the conductor layers illustrated in FIGS. 2A and 2B. That is, FIG. 9 illustrates a cross-sectional photograph of a constricted via conductor (7a) and a non-constricted via conductor (7b). As is clear from FIG. 9, when a conductor layer integrally formed with a via conductor is thick, a constricted portion is likely to be formed, and when the conductor layer is thin, a constricted portion is unlikely to be formed. Details about this point will be described later. Therefore, first, the laminated structures of the conductor layers are described.

In the description of the wiring substrate 1, a side farther from the core layer 10 in a thickness direction of the wiring substrate 1 is also referred to as an "upper side" or simply "upper," and a side closer to the core layer 10 is also referred to as a "lower side" or simply "lower." Further, for the conductor layers, conductor patterns included in the conductor layers, and the interlayer insulating layers 6, a surface facing an opposite side with respect to the core layer 10 is also referred to as an "upper surface," and a surface facing the core layer 10 side is also referred to as a "lower surface." Further, the thickness direction of the wiring substrate 1 is also simply referred to as a "Z direction."

In the present embodiment, the difference between the first conductor layer 11 and the second conductor layer 12 is that the thickness (T1) of the metal foil layer (11a) of the first conductor layer 11 is larger than the thickness (T2) of the metal foil layer (12a) of the second conductor layer 12. In the example of FIG. 1, the first intermediate conductor layer 31, the first inner-layer conductor layers (50a, 50b), the second intermediate conductor layer 32, and the second inner-layer conductor layers (50d, 50e) are each formed of the second conductor layer 12 having the second laminated structure as illustrated in FIG. 2B. In the present specification, when it is not necessary to distinguish between the inner-layer conductor layers (50a-50l), the inner-layer conductor layers (50a-50f) are also referred to as "the inner-layer conductor layers 50."

In the example illustrated in FIG. 1, similar to the first outer conductor layer 41 and the second outer conductor layer 42, the first inner conductor layer 21, the second inner conductor layer 22 and the inner-layer conductor layers (50c, 50f) are each formed of the first conductor layer 11. However, it is not always necessary that the first inner conductor layer 21, the second inner conductor layer 22 and the inner-layer conductor layers (50c, 50f) are each formed of the first conductor layer 11. Further, conversely, the first outer conductor layer 41 and the second outer conductor layer 42 also do not need to be each formed of the first conductor layer 11, but may be each formed of the second conductor layer 12. When the first and second outer conductor layers (41, 42) are each formed of the first conductor layer 11, a steep first recess 416 (see FIG. 3A) (to be described later) is likely to be formed on a surface thereof. Therefore, it is thought that this contributes to suppression of peeling of a protective layer partially formed on the surface, or contributes to suppression of warpage of the wiring substrate 1. That is, as long as at least one of each of the first and second inner conductor layers (21, 22) and each of the first and second outer conductor layers (41, 42) is formed of the first conductor layer 11 and the first and second intermediate conductor layers (31, 32) are each formed of the second conductor layer 12, the other conductor layers may each be any one of the first conductor layer 11 and the second conductor layer 12. By including conductor layers having such different structures, a wiring substrate having combined features thereof can be obtained.

As illustrated in FIG. 2A, the first conductor layer 11 having the first laminated structure includes at least a metal foil layer (11a) and a plating film layer (11c), the metal foil layer (11a) having a predetermined thickness (T1) of, for example, about 5 μm or more and 15 μm or less. The first conductor layer 11 of FIG. 2A further includes an intermediate metal layer (11b) between the metal foil layer (11a) and the plating film layer (11c). The first conductor layer 11 is patterned, for example, using a subtractive method.

The metal foil layer (11a) is, for example, formed of a metal foil containing copper, nickel, or the like as a main material. The plating film layer (11c) is, for example, a plating film formed by electrolytic plating, and a material thereof is, for example, copper, nickel, or the like. The intermediate metal layer (11b) is used as a seed layer that can function as an electrode when the plating film layer (11c) is formed by electrolytic plating. Since an electrode is also on an inner surface of a hole in an interlayer insulating layer 6 in which a via conductor 7 is formed, the intermediate metal layer (11b) is formed. A material of the intermediate metal layer (11b) is, for example, copper, nickel, or the like. The intermediate metal layer (11b) is formed, for example, by electroless plating, sputtering, vacuum deposition, or the like. In the first conductor layer 11, the metal foil layer (11a) faces toward a lower side (the core layer 10 side).

FIG. 2B illustrates an example of the second conductor layer 12 having the second laminated structure formed in at least one of the inner-layer conductor layers 50. As illustrated in FIG. 2B, the second conductor layer 12 includes at least a metal foil layer (12a) and a plating film layer (12c), the metal foil layer (12a) having a thickness (T2) of, for example, about 0.5 μm or more and 5 μm or less, which is smaller than the predetermined thickness (T1) of the metal foil layer (11a) of the above-described first conductor layer 11. Even when the thickness of the metal foil layer (12a) is 5 μm, the metal foil layer (12a) may be thinner than the metal foil layer (11a) of the first conductor layer 11. The second conductor layer 12 of FIG. 2B further includes an intermediate metal layer (12b) between the metal foil layer (12a) and the plating film layer (12c). As compared to the first conductor layer 11, a conductor pattern can be formed at a fine pitch in the second conductor layer 12 that includes the metal foil layer (12a) thinner than the metal foil layer (11a) of FIG. 2A. A conductor pattern of the second conductor layer 12 can be formed, for example, using a semi-additive method using a metal foil (so-called MSAP method: Modified Semi Additive Process). According to this method, a patterned plating film layer (12c) can be directly obtained. However, the metal foil layer (12a) and the intermediate metal layer (12b) are formed on an entire surface and are separated according to a pattern. In this case, the metal foil layer (12a) and the intermediate metal layer (12b) are both thin, and thus, can be separated by etching the entire surface. As a result, a surface of the plating film layer (12c) is also etched, and thus, unevenness of the surface of the plating film layer (12c) is reduced.

Similar to the metal foil layer (11a) of the first conductor layer 11, the metal foil layer (12a) is formed of a metal foil containing copper, nickel, or the like as a main material. Similar to the intermediate metal layer (11b) of the first conductor layer 11, the intermediate metal layer (12b) is formed, for example, by electroless plating, sputtering, vacuum deposition, or the like using copper, nickel, or the like, and can function as a seed layer in forming the plating film layer (12c). Then, the plating film layer (12c) is preferably formed by electrolytic plating using, for example, copper, nickel, or the like. In the second conductor layer 12, the metal foil layer (12a) faces toward a lower side (the core layer 10 side).

Next, formation of the via conductors 7 (7a, 7b) and the first and second conductor layers (11, 12) integrally formed with the via conductors 7 is described. As described above, the via conductors 7 are formed by filling holes formed in the interlayer insulating layers 6 with conductors, and the conductor layers are formed thereon. For example, formation of a constricted via conductor (7a) (having a constricted portion 74) and a plating film layer (11c) as illustrated in FIG. 3A is performed by forming a hole 71 (see FIGS. 4A and 4B) in an interlayer insulating layer 6 and filling the hole 71 with a conductor by, for example, electrolytic plating or the like, and forming a plating film on a surface thereof. As a result, a conductor layer integrated with a via conductor 7 is formed.

Figure 4A:
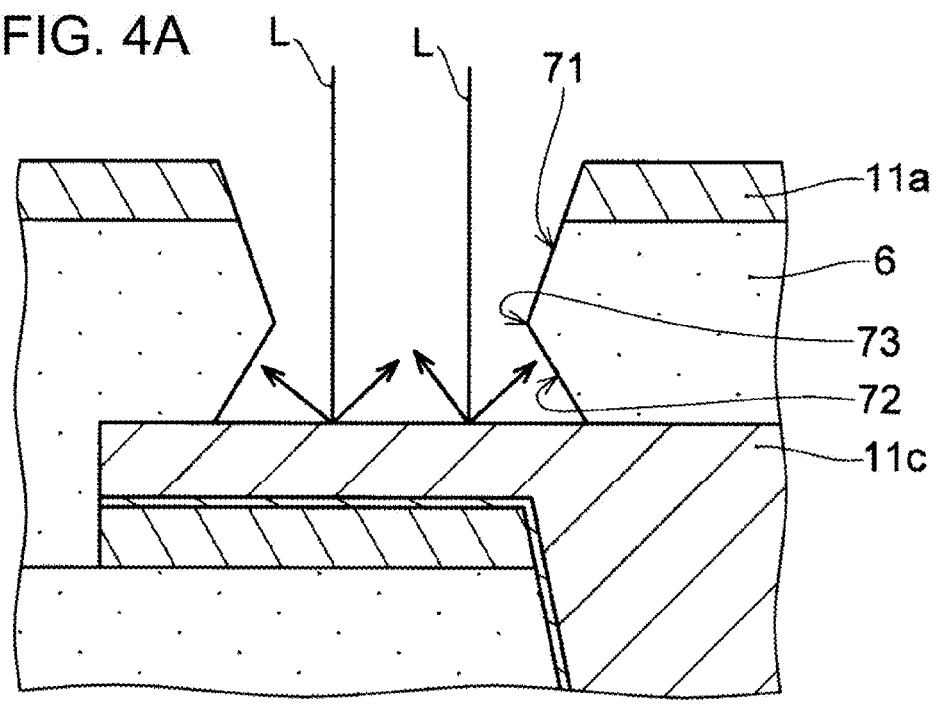
FIG. 4A is an explanatory diagram describing formation of a hole in an interlayer insulating layer before a via conductor of FIG. 3A is formed.

For example, as illustrated in FIG. 4A, in a state in which an interlayer insulating layer 6 and a metal foil layer (11a) are laminated, this hole 71 is formed by removing a portion of the interlayer insulating layer 6 using $CO_2$ laser or the like. In this case, since the metal foil layer (11a) is formed of a metal, an opening is formed in the metal foil layer (11a) using a high power laser beam (L) by increasing the intensity of the laser beam (L), and an opening is also formed in the interlayer insulating layer 6 using a laser beam (L) of the same condition. The laser beam L may be irradiated in an appropriate number of shots larger than that in a case where an opening is formed only in the insulating layer 6. In this case, the opening of the metal foil layer (11a) is subjected to a blackening treatment or the like. However, for example, when the metal foil layer (11a) is thick as illustrated in FIG. 2A, the hole 71 is formed by irradiating a stronger laser beam (L), or by irradiating a laser beam (L) at a larger number of shots. On the other hand, when the metal foil layer (12a) is thin as illustrated in FIG. 2B, the hole 71 is formed with a weaker laser beam (L) or at a smaller number of shots as compared to that when the opening in the metal foil layer (11a) is formed. In this way, by changing the intensity or the number of shots of the laser beam (L), openings having different shapes as described below can be formed.

As illustrated in FIG. 4A, in the case where the hole 71 is formed by irradiating a laser beam (L), when resin remains on a bottom surface, electrical connection of the via conductor 7 becomes insufficient, and electrical resistance thereof increases. Therefore, irradiation of the laser beam (L) is performed for a long time period even after the interlayer resin insulating layer 6 is perforated so that residues of the interlayer insulating layer 6 are completely removed. In this case, when the intensity of the laser beam (L) is high or the number of shots is large, the laser beam is reflected by a metal on the bottom surface where almost all the resin of the interlayer insulating layer 6 has been removed, that is, reflected by the conductor layer (12 or 11) as a lower layer. The surface of the conductor layer as a lower layer has unevenness (not illustrated in the drawings), which causes irregular reflection so that a bottom side of the hole 71 is further removed. As a result, as illustrated in FIG. 4A, at a lower portion of a side wall of the hole 71, that is, on a bottom surface side of a hole 71 as a first tapered portion that is decreased in diameter toward the bottom surface side, a lower hole 72 as a second tapered portion that tapers in an opposite direction with respect to the first tapered portion and is increased in diameter (is increased in cross-sectional area) toward a bottom surface side is formed. The lower hole 72 at the bottom of the hole 71 is easily formed when the metal foil layer (11a) is thick. However, regardless of the thickness of the metal foil layer, by increasing the intensity of the laser beam or increasing the number of shots, the hole (71, 72) having the shape illustrated in FIG. 4A can be intentionally formed.

The term "decreased in diameter" and the term "increased in diameter" are used for convenience, and term "decreased in diameter" means that an area of cross section perpendicular to the Z direction of a via conductor 7 or a through-hole conductor (10a) is reduced, and the term "increased in diameter" means that the area of the cross section is increased.

Then, a convex portion 73 is formed at a boundary between the hole 71 as the first tapered portion and the lower hole 72 as the second tapered portion. In other words, a cross-sectional shape thereof is an hourglass shape. As described above, a thick metal foil layer (11a) does not necessarily result in a hole having such a shape. The cross-sectional shape of a via conductor 7 can vary depending on the intensity of the laser beam (L), the number of shots, the shape of the conductor layer forming the bottom surface of the hole (71, 72), and the like. However, when the metal foil layer (11a) is thick, as compared to the case of the like metal foil layer (12a) having a small thickness, such an hourglass-shaped hole (71, 72) is easily formed.

The convex portion 73 is formed at a middle position in the thickness direction of the interlayer insulating layer 6 in which the hole 71 is formed, or on the bottom surface side of the hole 71. This is because the lower hole 72 is formed by reflected laser beam (L) and the laser beam (L) becomes weaker with increasing distance from the bottom surface. Further, in FIG. 4A, the lower hole 72 is exaggerated and is drawn to have a comparable size as the upper hole 71, but is smaller in both diameter and depth than the hole 71 as the first tapered portion.

Figure 4B:
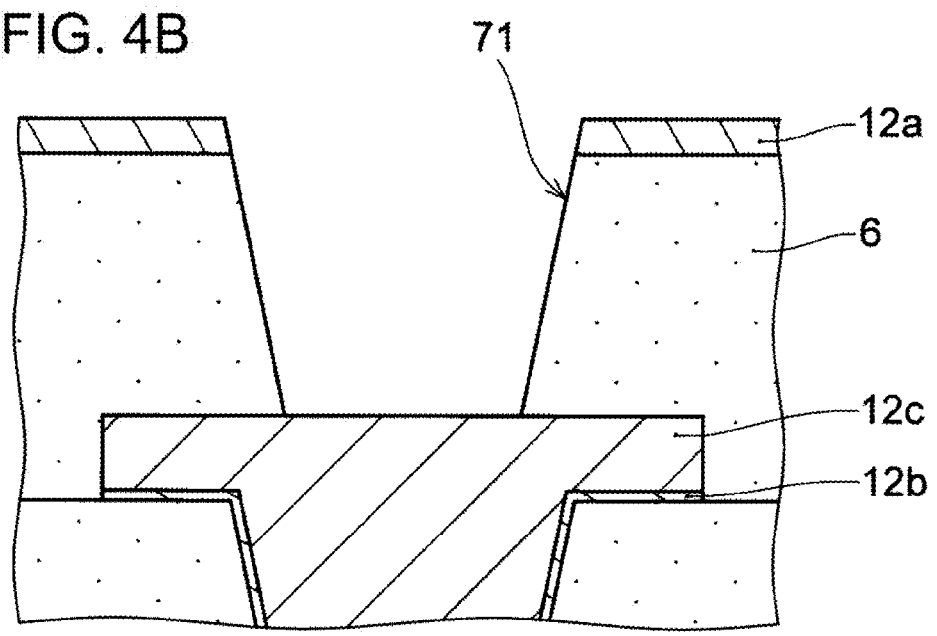
FIG. 4B is an explanatory diagram describing formation of a hole in an interlayer insulating layer before a via conductor of FIG. 3B is formed.

On the other hand, as illustrated in FIG. 4B, in the case where a conductor layer on an interlayer insulating layer 6 is the second conductor layer 12 having the second laminated structure illustrated in FIG. 2B, the metal foil layer (12a) has a small thickness. Therefore, in forming a hole 71, the metal foil layer (12a) can be penetrated even when a laser beam is not so strong. Therefore, the resin insulating layer 6 is also gently removed (etched), and exposure of the plating film layer (12c) as a lower layer can be easily controlled. As a result, it is not necessary to excessively continue laser beam irradiation after the plating film layer (12c) as a lower layer is exposed, and an effect of etching due to irregularly reflected light is suppressed. Further, even when reflected light hits a side wall of the hole 71, since the laser beam is weak, the side wall of the hole 71 is not significantly removed. As a result, a lower hole 72 as illustrated in FIG. 4A is likely not formed. Then, as illustrated in FIG. 4B, the hole 71 is likely to have a tapered shape of the first tapered portion that is decreased in diameter toward the core layer 10, or have a cylindrical shape having substantially no change in diameter.

A via conductor 7 is formed by filling the hole (71, 72) with a conductor. Therefore, an outer shape of the via conductor 7 matches a shape surrounding the hole (71, 72). As described above, various methods can be used for filling holes with conductors. For example, in the case of being formed by electrolytic plating, the via conductors 7 and the conductor layers (11, 12) are each formed by energizing in a plating solution using each of the, intermediate metal layers (11b, 12b) (metal foil layers (11a, 12a)) as an electrode. Therefore, theoretically, a metal is deposited on the intermediate metal layer (11b). Therefore, in the case of the hole (71, 72) as illustrated in FIG. 4A, the constricted via conductor (7a) having the constricted portion 74 as illustrated in FIG. 3A is formed, and, in the case of the hole 71 as illustrated in FIG. 4B, the via conductor (7b) that is decreased in diameter toward the core layer 10 or has no change in diameter is formed. As described above, in the case of the thick metal foil layer (11a) as illustrated in FIG. 4A, as compared to the case of the thin metal foil layer (12a) as illustrated in FIG. 4B, a constricted hole including a lower hole 72 is likely to be formed. Therefore, in the case of the thick metal foil layer (11a), the via conductor 7 is often formed into the constricted via conductor (7a) having the constricted portion 74. Therefore, the first group of via conductors integrally formed with a first conductor layer 11 includes constricted via conductors (7a) at a larger proportion than a second group of via conductors 7 integrally formed with each of the inner-layer conductor layers (50a, 50b) and the like (which are each formed of the second conductor layer 12) among the first inner-layer conductor layers and second inner-layer conductor layers 50.

Except for the constricted via conductors (7a), the via conductors 7 each have a first tapered portion that is decreased in diameter toward the core layer 10 in the Z direction. As described above, the constricted via conductors (7a) are filled in the holes 71 that each have a lower hole 72 as a second tapered portion, and each have a second tapered portion that is increased in diameter toward the core layer 10, and each have a constricted portion 74 at a boundary thereof.

Recesses are likely to be formed on surfaces on via conductors 7 of a conductor layer integrally formed with the via conductors 7. This is because, for example, when electrolytic plating is performed, metal deposition from inside of the holes 71 is performed, and finally, the conductor layers (11a, 12a) are formed on the surfaces, and thus, recesses are likely to be formed at central portions of the holes 71. Then, as illustrated in FIG. 4A, the constricted via conductors (7a) formed in the holes 71 in each of which the lower hole 72 is also formed each form a shape that has the constricted portion 74. Further, a volume of each hole 71 with a lower hole 72 is increased, and thus, a recess on a surface thereof is increased. As a result, a large recess is formed on a surface of a constricted via conductor (7a) having a constricted portion 74, and a steep first recess 416 is also formed on the plating film layer (11c) integrally formed on the surface. Even when this constricted via conductor (7a) is formed by sputtering or the like without relying on electrolytic plating, metal layers are laminated from a bottom surface, and thus, a deep recess is formed on a surface of a via conductor 7 filled in a large hole.

That is, in the constricted via conductors (7a) integrally formed with the first conductor layer 11 of the first and second outer conductor layers (41, 42) and the like that are each formed the first conductor layer 11, more via conductors each having a constricted portion 74 and an hourglass-shaped cross-sectional shape are likely to be formed than in the case of the first and second intermediate conductor layers (31, 32) that are each formed of the second conductor layer 12. Further, steep first recesses 416 (see FIG. 3A) are likely to be formed on the first conductor layer 11 on the constricted via conductors (7a) each having the constricted portion 74. Further, in the first and second intermediate conductor layers (31, 32) each formed of the second conductor layer 12, the via conductors (7b) are often formed each having a tapered shape that is decreased in diameter toward the core layer 10 or a cylindrical shape having no change in diameter, and shallow second recesses 316 are often formed on surfaces thereof. The shapes of the holes 71 can vary depending on the intensity of the laser beam and other conditions such as the number of shots, and accordingly, the via conductors 7 can be formed to have various shapes. However, in the second group of via conductors 7 integrally formed with the second conductor layer 12, among the via conductors 7 of the second group, a proportion of the via conductors (7b) each having a tapered shape that is decreased in diameter toward the core layer 10 is larger than a proportion of via conductors 7 having other shapes.

In the first or second outer conductor layer (41, 42) which can have the constrained via conductors (7a) having the shape as illustrated in FIG. 3A, the steep first recesses 416 are likely to be formed as described above. Therefore, protective layers such as the solder resist layers (81, 82) partially formed on surfaces of outermost-layer conductor layers such as the first and second outer conductor layers (41, 42) have good biting into the first recesses 416. Therefore, it is thought that reliability with respect to warpage of the wiring substrate 1 or peeling of the protective layers such as the solder resist layers (81, 82) is improved.

On the other hand, in the first or second intermediate conductor layer (31, 32) that can be integrally formed with the via conductors (7b) that are each decreased in diameter toward the core layer 10 as illustrated in FIG. 3B, as described above, the shallow second recesses 316 are likely to be formed. Therefore, this is preferable in the case of the multiple laminated inner-layer conductor layers 50 (50a-50f). That is, when the layers are laminated on almost the entire surface, it may be preferable for the laminated layers to be flatter. However, even in the case of lamination, it is thought that lamination with a structure having the steep first recesses 416 in the middle may allow warpage of or peeling in the wiring substrate 1 to be easily prevented. Therefore, in the inner-layer conductor layers 50, conductor layers having these different recess structures can be combined.

Returning to FIG. 1, the wiring substrate 1 illustrated in FIG. 1 include 12 conductor layers in total. However, the number of the conductor layers of the wiring substrate 1 is not limited to 12. The wiring substrate 1 can include an arbitrary number of three or more of conductor layers on each of the first surface (10F) side and the second surface (10S) side of the core layer 10. For example, the wiring substrate 1 may include the first intermediate conductor layer 31 and any number of first inner-layer conductor layers 50 between the first inner conductor layer 21 and the first outer conductor layer 41. Further, the second intermediate conductor layer 32 and any number of second inner-layer conductor layers 50 may be included between the second inner conductor layer 22 and the second outer conductor layer 42 on the second surface (10S) side.

The wiring substrate 1 in FIG. 1 further includes through-hole conductors (10a) provided in the core layer 10. The through-hole conductors (10a) penetrate the core layer 10 and connect the first inner conductor layer 21 and the second inner conductor layer 22 to each other.

The wiring substrate 1 of the embodiment illustrated in FIG. 1 includes the three inner-layer conductor layers (50a, 50b, 50c) in addition to the first intermediate conductor layer 31 between the first inner conductor layer 21 and the first outer conductor layer 41. Further, the wiring substrate 1 includes the three inner-layer conductor layers (50d, 50e, 500 in addition to the second intermediate conductor layer 32 between the second inner conductor layer 22 and the second outer conductor layer 42. The interlayer insulating layers 6 are respectively provided between the inner-layer conductor layers (50a-50f) or between the inner-layer conductor layers (50a-50f) and adjacent conductor layers (the first and second inner conductor layers (21, 22), the first and second intermediate conductor layers (31, 32), and the first and second outer conductor layers (41, 42)). A build-up layer on the first surface (10F) side is formed by the first inner conductor layer 21, the first inner-layer conductor layers (50a-50c), the first intermediate conductor layer 31, the first outer conductor layer 41, and, the interlayer insulating layers 6 formed on the first surface (10F) side of the core layer 10. Similarly, a build-up layer on the second surface (10S) side is formed by the second inner conductor layer 22, the second inner-layer conductor layers (50d-50f), the second intermediate conductor layer 32, the second outer conductor layer 42, and the interlayer insulating layers 6 formed on the second surface (10S) side of the core layer 10.

Among the conductor layers included in the wiring substrate 1, the "inner-layer conductor layers" include all conductor layers other than the outermost conductor layers exposed on both sides of the wiring substrate 1, that is, the first and second outer conductor layers (41, 42), the innermost layers formed on the first surface (10F) and the second surface (10S) of the core layer 10, that is, the first inner conductor layer 21 and the second inner conductor layer 22, and the first intermediate conductor layer 31 and the second intermediate conductor layer 32 that are formed between the inner conductor layers and the outer conductor layers. The inner-layer conductor layers 50 may each be formed of any of the above-described first conductor layer 11 and second conductor layer 12, and conductor layers having other laminated structures such as a structure without a metal foil layer.

The inner-layer conductor layers 50 can be formed in the wiring substrate by combining the various conductor layers described above. In this case, a proportion of constricted via conductors (7a) included in a group of via conductors 7 integrally formed with the first conductor layer 11 is larger than a proportion of constricted via conductors (7a) included in a group of via conductors 7 integrally formed with the second conductor layer 12. The inner-layer conductor layers 50 may be a combination of inner-layer conductor layers 50 having various structures, or all the inner-layer conductor layers 50 may each be formed of the first conductor layer 11, or all the inner-layer conductor layers 50 may each be formed of the second conductor layer 12.

Figure 5:
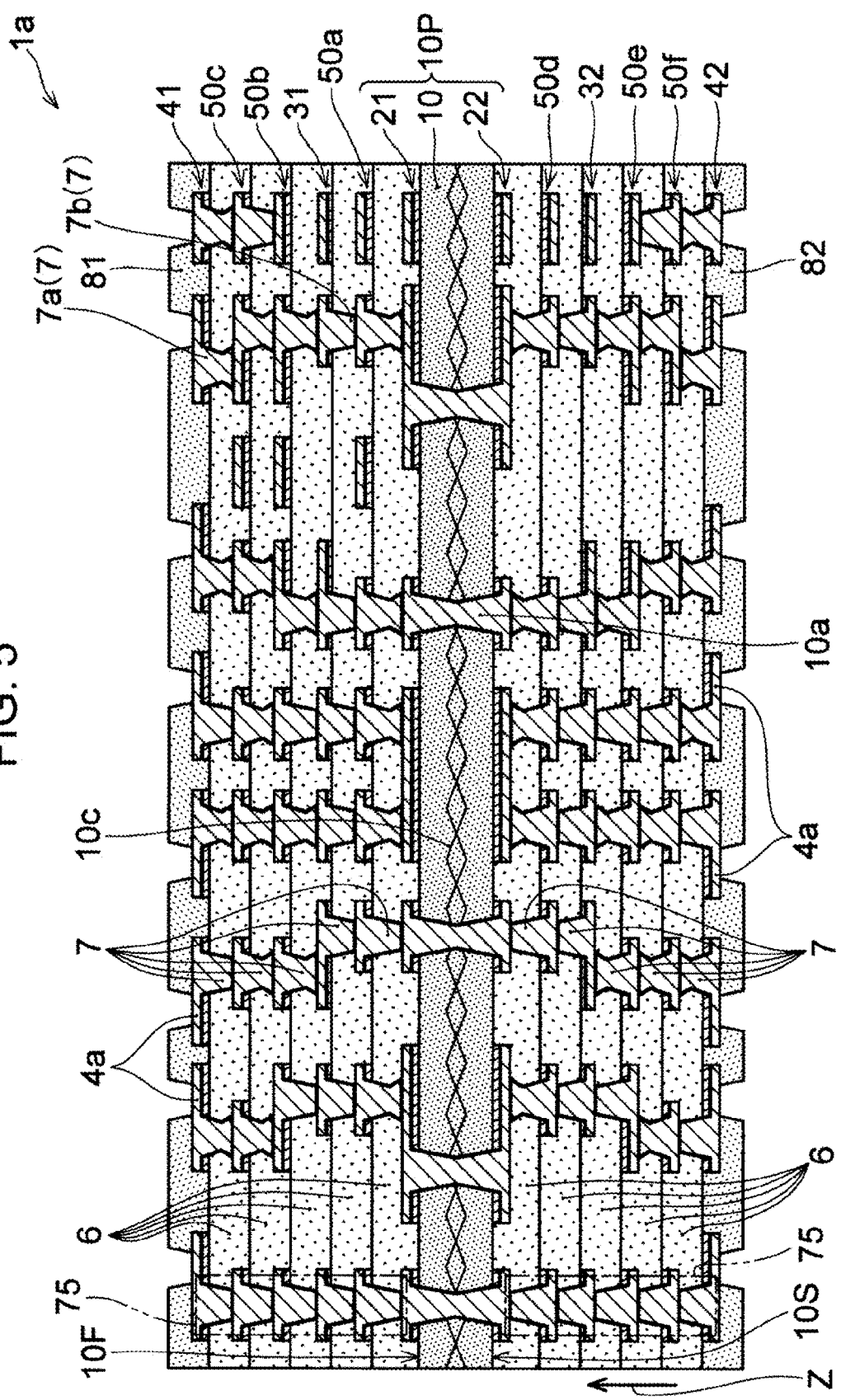
FIG. 5 is a cross-sectional view illustrating another example of a wiring substrate of an embodiment of the present invention, in which an entire conductor layer is formed of the first conductor layer.

FIG. 5 illustrates an example of a wiring substrate (1a) in which all the inner-layer conductor layers 50, and the first and second inner conductor layers (21, 22), and the first and second outer conductor layers (41, 42) are all each formed of the first conductor layer 11. That is, all the conductor layers other than the first and second intermediate conductor layers (31, 32) are each formed of the first conductor layer 11. In this case, as is clear from FIGS. 5 and 6, a proportion of the constricted via conductors with respect to all the via conductors 7 is larger than that in the case of the via conductors 7 formed by the second conductor layer 12 to be described later with respect to FIGS. 5 and 6. In FIGS. 1 and 5-7, the via conductors 7 integrally formed with the second conductor layer 12 are all non-constricted via conductors (7b) (7), but constricted via conductors (7a) can also be formed. In FIG. 5, a portion that is the same as in FIG. 1 is denoted using the same reference numeral symbol and description thereof is omitted.

Figure 6:
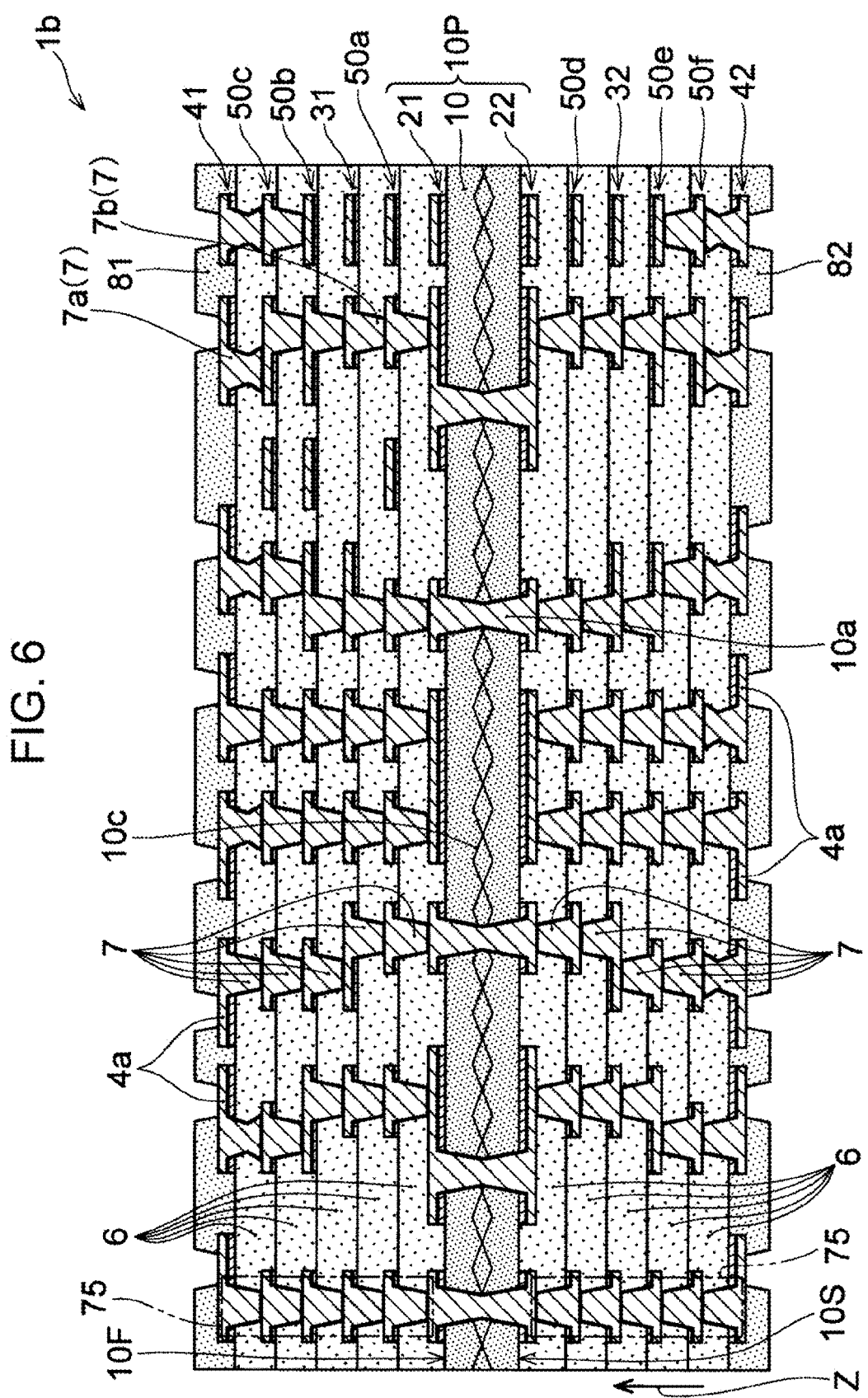
FIG. 6 is a cross-sectional view illustrating another example of a wiring substrate of an embodiment of the present invention, in which an entire conductor layer is formed of the second conductor layer.

FIG. 6 illustrates an example of a wiring substrate (1b) in which all the inner-layer conductor layers 50 are each formed of the second conductor layer 12. In this example, the first and second inner conductor layers (21, 22) and the first and second outer conductor layers (41, 42) are each formed of the first conductor layer 11, and, between these layers, all the first and second intermediate conductor layers (31, 32) and the first and second inner-layer conductor layers 50 are each formed of the second conductor layer 12. In the via conductors 7 integrally formed with the second conductor layer 12, the constricted via conductors (7a) are substantially not formed. Even when the via conductors 7 are integrally formed with the second conductor layer 12, depending on a laser beam irradiation condition and the like, the proportion of the constricted via conductors (7a) can be increased. In FIG. 6, a portion that is the same as in FIG. 1 is denoted using the same reference numeral symbol and description thereof is omitted.

The first outer conductor layer 41 and the second outer conductor layer 42 include connection pads (4a) on which electronic components (not illustrated in the drawings) are to be mounted. The wiring substrate 1 in FIG. 1 further includes a solder resist layer 81 formed on the first outer conductor layer 41, and a solder resist layer 82 formed on the second outer conductor layer. The solder resist layers (81, 82) have openings that respectively expose the connection pads (4a). The solder resist layers (81, 82) are each formed using, for example, an epoxy resin, a polyimide resin, or the like. As described above, since the deep first recesses 416 (see FIG. 3A) are likely to be formed on the surfaces on the constricted via conductors (7a) of the first and second outer conductor layers (41, 42), the solder resist layers (81, 82) have good biting into the recesses, and reliability with respect to peeling is improved.

The core layer 10 and the interlayer insulating layers 6 are each formed using any insulating material. Examples of the insulating material include an epoxy resin, a bismaleimide triazine resin (BT resin), a phenol resin, and the like. The insulating layers formed using these resins may each contain a reinforcing material such as a glass fiber or an aramid fiber, and/or inorganic filler such as silica. In the example of FIG. 1, the core layer 10 contains a reinforcing material (10c).

Although not illustrated in the drawings, some or all of the multiple interlayer insulating layers 6 may each contain a reinforcing material.

The through-hole conductors (10a) are also each formed by an electroless plating film and an electrolytic plating film of copper, nickel, or the like. The through-hole conductors (10a) are formed together and integrally with the first and second inner conductor layers (21, 22). Further, in the example of FIG. 1, each of the through-hole conductors (10a) is decreased in diameter from the first surface (10F) and the second surface (10S) of the core layer 10 toward a center part of the each of the through-hole conductors (10a) in the Z direction, and has a neck part at the center part in the Z direction where a cross-sectional area of the each of the through-hole conductors (10a) becomes smallest.

In the example of FIG. 1, as illustrated on the left side of FIG. 1, the wiring substrate 1 includes stacked via conductors 75. The stacked via conductors 75 are each formed by a stack of via conductors 7 formed at positions overlapping each other in a plan view in the interlayer insulating layers 6. By two stacked via conductors 75 and a through-hole conductor (10a), the first outer conductor layer 41 and the second outer conductor layer 42 are electrically connected to each other through a substantially shortest path and are connected to the other conductor layers. When such via conductors 7 are continuously formed, from a point of view that the via conductors 7 can be stably stacked on one another, an upper surface of each of the via conductors 7 is preferably formed to have a relatively shallow recess such as the above-described second recess 316 or a structure without a recess.

The first and second inner conductor layers (21, 22), the first and second intermediate conductor layers (31, 32), the first and second inner-layer conductor layers (50a-50f), and the first and second outer conductor layers (41, 42) can each be formed, for example, using any metal such as copper, nickel, silver, or palladium alone or using two or more of these metals in combination. However, these conductor layers can have different structures from each other.

Further, the thickness (T1) of the metal foil layer (11a) in the first conductor layer 11 is larger than the thickness (T2) of the metal foil layer (12a). Therefore, diffusion of solder supplied to connection pads (4b) into the connection pads (4b) is thought to be relatively difficult to reach interfaces between the first or second outer conductor layer (41, 42) and the interlayer insulating layers 6. Therefore, it is thought that a decrease in adhesion strength at the interfaces is unlikely to occur.

The first and second inner conductor layers (21, 22), the first and second intermediate conductor layers (31, 32), the first and second inner-layer conductor layers 50, and the first and second outer conductor layers (41, 42) each have a thickness of, for example, about 10 μm or more and 40 μm or less. The thickness (T1) of the metal foil layer (11a) included in each of the first and second outer conductor layers (41, 42) and the like is larger than the thickness (T2) of the metal foil layer (12a) included in each of the inner-layer conductor layers 50. Therefore, from a point of view of ensuring a desired thickness for each of the conductor layers, the plating film layer (11c) included in the first conductor layer 11 may have a smaller thickness than the plating film layer (12c) included in the second conductor layer 12.

Figure 7:
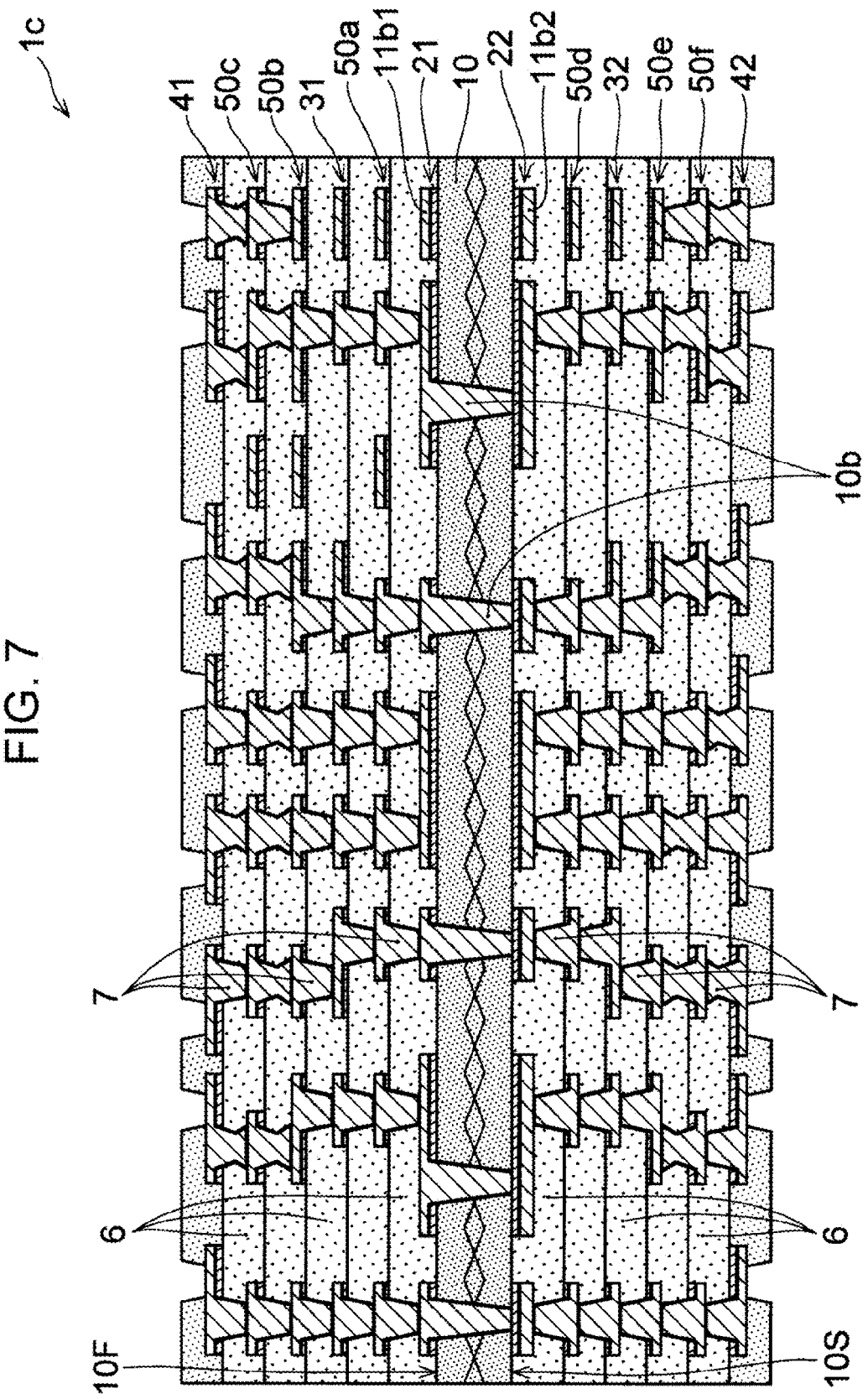
FIG. 7 is a cross-sectional view illustrating another example of a wiring substrate of an embodiment of the present invention.

FIG. 7 illustrates a cross-sectional view of a wiring substrate (1c) which is yet another example of the wiring substrate of the present embodiment. Instead of the through-hole conductors (10a) illustrated in FIG. 1, the wiring substrate (1*c*) includes via conductors (10*b*) each of which penetrates the core layer 10 while being decreased in diameter toward only one direction. That is, the via conductors (10*b*) do not each have a neck portion that the through-hole conductors (10*a*) illustrated in FIG. 1 each have. The via conductors (10*b*) in the example of FIG. 7 are each decreased in diameter from the first surface (10F) side toward the second surface (10S) side of the core layer 10. Further, the via conductors (10*b*) in the example of FIG. 7 are integrally formed only with the first inner conductor layer 21. That is, the via conductors (10*b*) are bottomed via conductors similar to the via conductors 7. The wiring substrate of the embodiment may include the bottomed via conductors (10*b*) in the core substrate 10 as in the wiring substrate (1*c*) of FIG. 7. In FIG. 7, a portion that is the same as in FIG. 1 is denoted using the same reference numeral symbol and description thereof is omitted.

An example of a method for manufacturing the wiring substrate 1 illustrated in FIG. 1 is described below with reference to FIGS. 8A-8C.

Figure 8A:
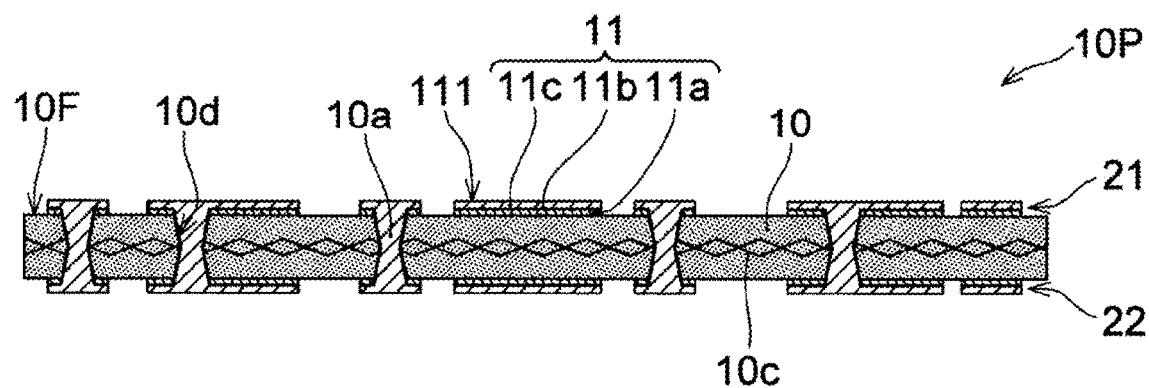
FIG. 8A is a cross-sectional view illustrating an example of a manufacturing process of a wiring substrate of an embodiment.

As illustrated in FIG. 8A, the core substrate (10P) is formed. For example, a laminated plate (for example, a double-sided copper-clad laminated plate) having the core layer 10 and metal foils respectively provided on both sides of the core layer 10 is prepared, the core layer 10 being formed of an insulating resin such as an epoxy resin and containing the reinforcing material (10*c*). Then, for example, using a subtractive method, the first inner conductor layer 21, the second inner conductor layer 22, and the through-hole conductors (10*a*) are formed, and the first and second inner conductor layers (21, 22) are patterned to have desired conductor patterns. When holes (10*d*) for connecting the first inner conductor layer 21 and the second inner conductor layer 22 to each other are provided in the core layer 10, by irradiating laser, for example, from both side of the core layer 10, the through-hole conductors (10*a*) having the shapes illustrated in FIGS. 1 and 8A can be formed. Further, by irradiating laser from only one side, for example, the first surface (10F) side of the core layer 10 to form bottomed holes, the via conductors (10*b*) illustrated in FIG. 7 are formed.

The first and second inner conductor layers (21, 22) are each foil led to have the first conductor layer 11. That is, the metal foils that are respectively provided on the both sides of the core layer 10 each form a metal foil layer (11*a*), and a seed layer formed by electroless plating for forming the through-hole conductors (10*a*) forms an intermediate metal layer (11*b*). Then, an electrolytic plating film formed on the seed layer forms a plating film layer (11*c*).

Figure 8B:
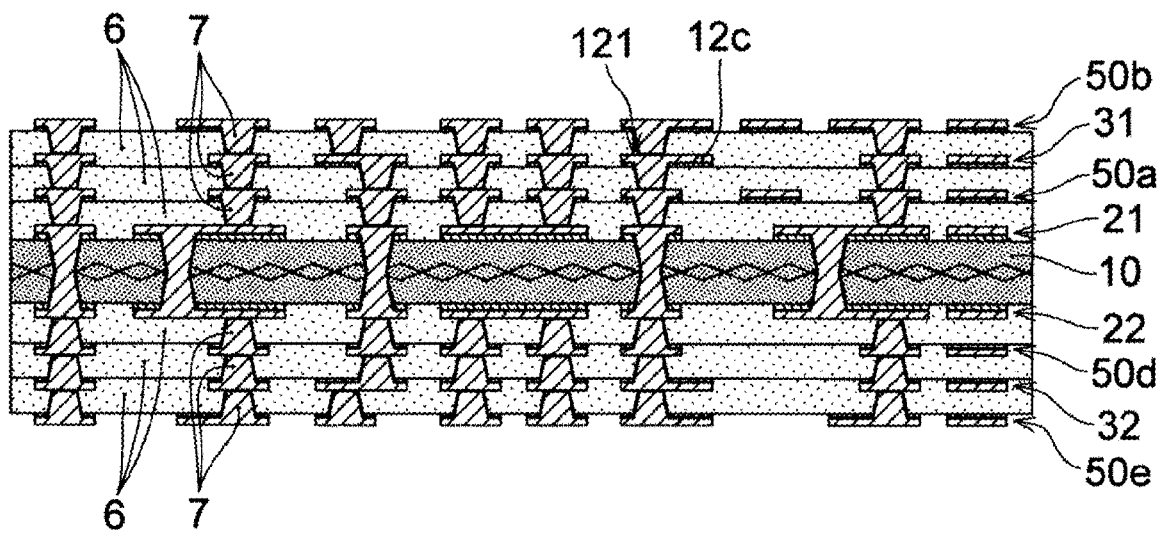
FIG. 8B is a cross-sectional view illustrating an example of a manufacturing process of the wiring substrate of the embodiment.

As illustrated in FIG. 8B, the interlayer insulating layers 6 and the conductor layers are alternately formed on both sides of the core layer 10 and the via conductors 7 are formed in the interlayer insulating layers 6. FIG. 8B illustrates an example of a state in which the formation of the inner-layer conductor layer (50*b*) and the inner-layer conductor layer (50*e*) has been completed. An example of a method for forming the first and second intermediate conductor layers (31, 32) and the inner-layer conductor layers (50*a*, 50*b*, 50*d*, 50*e*) is a semi-additive method using a metal foil.

On each of already formed inner-layer conductor layers (50*a*, 50*b*) or the like, for example, a sheet-like prepreg and a metal foil (which will become the metal foil layer of the second conductor layer) are sequentially laminated and thermocompression-bonded, and thereby, an interlayer insulating layer 6 is formed.

In forming the via conductors 7, as described above, by irradiating $CO_2$ laser from a surface of a metal foil on an interlayer insulating layer 6, hole for via conductors 7 are formed penetrating the metal foil and the interlayer insulating layer 6. A seed layer (which will become the intermediate metal layer of the second conductor layer) is formed on inner walls of the holes and on the metal foil by electrolytic plating, sputtering, or the like. Then, on the seed layer, a plating resist (not illustrated in the drawings) having openings at appropriate positions is provided, and, by electrolytic plating using the seed layer as an electrode, conductor patterns of the first and second inner-layer conductor layers 50 and via conductors 7 are respectively formed in the openings of the plating resist and in the holes. The plating film formed by electrolytic plating forms the plating film layer (12*c*) of the second conductor layer 12 (see FIG. 3B). The plating resist (not illustrated in the drawings) is removed, and unwanted portions of the metal foil and the seed layer are removed by etching or the like.

Figure 8C:
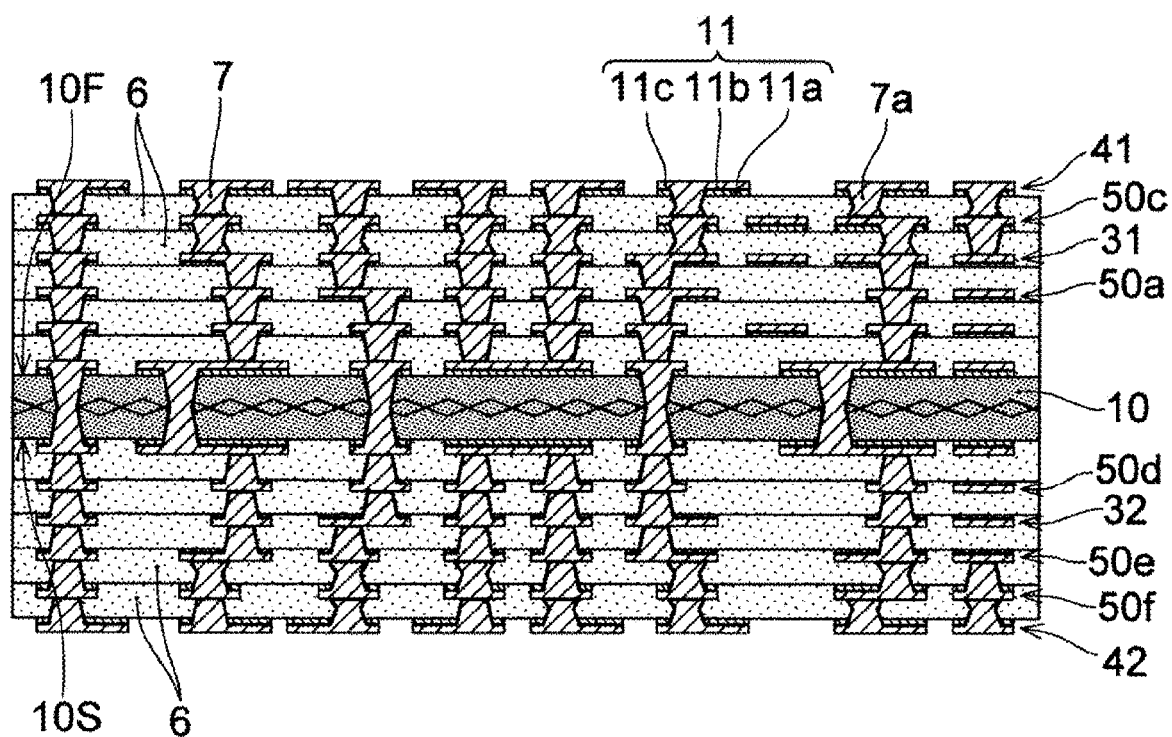
FIG. 8C is a cross-sectional view illustrating an example of a manufacturing process of the wiring substrate of the embodiment.

Further, as illustrated in FIG. 8C, on the first surface (10F) side of the core layer 10, the inner-layer conductor layer (50*d*) and the first outer conductor layer 41, and the interlayer insulating layers 6 are formed, and, on the second surface (10S) side, the inner-layer conductor layer (500 and the second outer conductor layer 42, and the interlayer insulating layers 6 are formed. As described above with reference to FIG. 8B, the interlayer insulating layers 6 are each formed, for example, by thermocompression-bonding of a sheet-like prepreg and the like. A method of forming the inner-layer conductor layers (50*c*, 50*f*) is not particularly limited. In the example of FIG. 8C, the inner-layer conductor layers (50*c*, 50*f*) are formed using a subtractive method using a metal foil.

The first and second outer conductor layers (41, 42) are each formed of the first conductor layer 11 having the first laminated structure. An example of a method for forming the first and second outer conductor layers (41, 42) is a subtractive method using a metal foil. That is, on each of the already formed inner-layer conductor layers (50*c*, 50*f*), a metal foil (which will become the metal foil layer (11*a*) of the first conductor layer 11) is laminated together with a prepreg (which will become an interlayer insulating layer 6). For this metal foil, a metal foil thicker than the metal foil used in forming the first and second inner-layer conductor layers (50*a*, 50*d*) and the like that are each formed of the second conductor layer 12 is used.

Holes 71 (see FIG. 4A) for forming the via conductors 7 are formed in the metal foil layer (11*a*) and the interlayer insulating layer 6 below the metal foil layer (11*a*) by, for example, $CO_2$ laser irradiation. Subsequently, a seed layer (which will become the intermediate metal layer (11*b*) of the first conductor layer 11) is formed by electroless plating or the like in the holes 71 and on the entire surface of the metal foil layer (11*a*). Further, by electroplating using the seed layer as an electrode, a plating film (which will become the plating film layer (11*c*) of the first conductor layer 11) is formed on the entire surface of the seed layer. As a result, the first and second outer conductor layers (41, 42) each formed of the first conductor layer 11 are formed, and the via conductors 7 are formed in the holes 71. Thereafter, the first and second outer conductor layers (41, 42) are patterned using a subtractive method.

Thereafter, the solder resist layer 81 is formed on the first outer conductor layer 41, and the solder resist layer 82 is formed on the second outer conductor layer 42. The solder resist layers (81, 82) are each formed by, for example, forming a resin layer containing a photosensitive epoxy resin or polyimide resin or the like, and performing exposure and development using a mask having an appropriate pattern. Through the above processes, the wiring substrate 1 in the example of FIG. 1 is completed. When necessary, a surface protective film (not illustrated in the drawings) formed of Au, Ni/Au, Ni/Pd/Au, solder, heat resistant preflux, or the like may be formed by electroless plating, solder leveling, spray coating, or the like on the connection pads (4a) exposed from the openings of the solder resist layers (81, 82).

As described above, the metal foil layer (11a) included in the first conductor layer 11 is relatively thick. Therefore, when a via conductor is formed together with a conductor layer formed of the first conductor layer 11, by simply adjusting the power of a laser beam so that the thick metal foil layer (11a) can be penetrated, a constricted via conductor (7a) having the shape illustrated in FIG. 3A can be easily formed.

Further, when a via conductor 7 is formed by electrolytic plating, by appropriately selecting a condition such as a plating current, regardless of a shape of a hole 71, the first recess 416 illustrated in FIG. 3A referred above can be formed on a surface of a conductor layer formed of the first conductor layer 11. Similarly, the recess 316 illustrated in FIG. 3B can be formed on a surface of a conductor layer formed of the second conductor layer 12.

A method for forming the first conductor layer 11 is not limited to a subtractive method. Further, a method for forming the second conductor layer 12 is not limited to a semi-additive method as long as the second conductor layer 12 includes a metal foil layer and a plating film layer, the metal foil layer being thinner than the metal foil layer included in the first conductor layer 11.

The wiring substrates of the embodiment are not limited to those having the structures illustrated in the drawings and those having the structures, shapes, and materials exemplified herein. For example, it is not always necessary to provide the through-hole conductors (10a) and the stacked via conductors 75. Further, it is also possible that the via conductors 7 do not each have a shape that is decreased in diameter toward the core layer 10 side. Further, it is not always necessary to provide the solder resist layers (81, 82).

The multilayer wiring board of Japanese Patent Application Laid-Open Publication No. 2014-154631 has a problem in via connection reliability. That is, a via is formed by filling a hole formed in an interlayer insulating film with a conductor. This hole is formed by irradiating a laser beam. However, as the laser beam advances into the interlayer insulating layer, the intensity of the laser beam decreases, so that the hole is formed in a tapered shape. Therefore, an area of a bottom surface of the hole is reduced. Further, when the laser beam irradiation is not sufficiently performed, the resin layer may partially remain on the bottom surface of the hole. When the resin layer partially remains, conduction performance deteriorates. As a result, there is a problem that electric resistance of the via as a whole may increase and peeling at the bottom of the via is likely to occur.

A wiring substrate according to an embodiment of the present invention includes: a core layer having a first surface and a second surface on an opposite side with respect to the first surface; a first inner conductor layer formed on the first surface; a second inner conductor layer formed on the second surface; a first outer conductor layer formed on an outermost layer on the first surface side; a second outer conductor layer formed on an outermost layer on the second surface side; a first intermediate conductor layer formed between the first inner conductor layer and the first outer conductor layer; a second intermediate conductor layer formed between the second inner conductor layer and the second outer conductor layer; interlayer insulating layers respectively interposed between the first inner conductor layer and the first intermediate conductor layer, between the first intermediate conductor layer and the first outer conductor layer, between the second inner conductor layer and the second intermediate conductor layer, and between the second intermediate conductor layer and the second outer conductor layer; and via conductors formed in the interlayer insulating layers, each via conductor connecting conductor layers arranged on both side of an interlayer insulating layer and being integrally formed with a conductor layer on an opposite side with respect to the core layer. Then, at least one of each of the first and second inner conductor layers and each of the first and second outer conductor layers is formed of a first conductor layer that includes at least a metal foil layer and a plating film layer, the metal foil layer having a predetermined thickness; the first and second intermediate conductor layers are each formed of a second conductor layer that includes at least a metal foil layer and a plating film layer, the metal foil layer having a thickness smaller than the predetermined thickness; and a first group of via conductors integrally formed with the first conductor layer includes constricted via conductors that each have a constricted portion between the conductor layer integrally formed with the first group of via conductors and a conductor layer that is connected to the first group of via conductors and is on the core layer side.

According to an embodiment of the present invention, via conductors each having a constricted portion have large connection areas at bottoms of the via conductors. As a result, peeling at the bottoms of the via conductors is unlikely to occur and electrical resistance of the via conductors can be reduced. On the other hand, via conductors that do not each have a constricted portion do not have neck portions that are easily broken in the middle of the via conductors, and thus, breakage inside the via conductors is unlikely to occur. It is thought that, by appropriately arranging these via conductors, overall connection reliability of the via conductors can be improved.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring substrate, comprising:
 a core layer;
 a plurality of first conductor layers formed on a first surface of the core layer and comprising a first inner conductor layer formed on the first surface of the core layer, a first outer conductor layer forming an outermost conductor layer on a first surface side of the core layer, and a first intermediate conductor layer formed between the first inner conductor layer and the first outer conductor layer;
 a plurality of second conductor layers formed on a second surface of the core layer on an opposite side with respect to the first surface of the core layer and comprising a second inner conductor layer formed on the second surface of the core layer, a second outer conductor layer forming an outermost conductor layer on a second surface side of the core layer, and a second intermediate conductor layer formed between the second inner conductor layer and the second outer conductor layer;

a plurality of interlayer insulating layers interposed between the first inner conductor layer and the first intermediate conductor layer, between the second inner conductor layer and the second intermediate conductor layer, between the first intermediate conductor layer and the first outer conductor layer, and between the second intermediate conductor layer and the second outer conductor layer; and a plurality of via conductors formed in the interlayer insulating layers such that each of the via conductors connects two conductor layers in one of the first and second conductor layers through one of the interlayer insulating layers and is integrally formed with one of the two conductor layers on a side away from the core layer, wherein at least one of the first and second inner conductor layers comprises a first conductor layer structure including a metal foil layer and a plating film layer, at least one of the first and second outer conductor layers comprises the first conductor layer structure, at least one of the first and second intermediate conductor layers comprises a second conductor layer structure including a metal foil layer and a plating film layer, and the plurality of via conductors includes a first group of via conductors integrally formed with the first conductor layer structure in at least one of the first and second outer conductor layers such that the first group of via conductors includes a plurality of constricted via conductors each of which has a constricted portion between the two conductor layers being connected thereby, and a plurality of non-constricted via conductors each of which does not have the constricted portion.

2. The wiring substrate according to claim 1, wherein each of the first and second intermediate conductor layers has the second conductor layer structure formed such that the metal foil layer of the second conductor layer has a thickness that is smaller than a thickness of the metal foil layer of the first conductor layer structure.

3. The wiring substrate according to claim 1, wherein each of the constricted via conductors has a first tapered portion decreasing in diameter toward the core layer and a second tapered portion increasing in diameter toward the core layer.

4. The wiring substrate according to claim 3, wherein the constricted portion of each of the constricted via conductors is on a core layer side with respect to a middle position in a thickness direction of a respective one of the interlayer insulating layers.

5. The wiring substrate according to claim 1, wherein each of the constricted via conductors has an hourglass-shape in a cross section.

6. The wiring substrate according to claim 1, wherein the plurality of via conductors includes a second group of via conductors integrally formed with the second conductor layer structure, and the first group of via conductors includes the plurality of constricted via conductors at a larger proportion than the second group of via conductors.

7. The wiring substrate according to claim 1, wherein the plurality of via conductors includes a second group of via conductors integrally formed with the second conductor layer structure such that the second group of via conductors includes a plurality of via conductors having a tapered shape decreasing in diameter toward the core layer at a larger proportion than a plurality of via conductors having other shapes.

8. The wiring substrate according to claim 1, wherein each of the first and second inner conductor layers has the first conductor layer structure, and each of the first and second outer conductor layers has the first conductor layer structure.

9. The wiring substrate according to claim 1, wherein the plurality of first conductor layers includes a plurality of inner-layer conductor layers formed between the first inner conductor layer and the first outer conductor layer, and the plurality of via conductors includes a plurality of via conductors stacked from the first inner conductor layer to the first outer conductor layer.

10. The wiring substrate according to claim 1, wherein the plurality of first conductor layers includes an inner-layer conductor layer formed between the first inner conductor layer and the first intermediate conductor layer such that the inner-layer conductor layer has one of the first conductor layer structure and the second conductor layer structure.

11. The wiring substrate according to claim 10, wherein the inner-layer conductor layer has the first conductor layer structure.

12. The wiring substrate according to claim 10, wherein the inner-layer conductor layer has the second conductor layer structure.

13. The wiring substrate according to claim 1, wherein the plurality of first conductor layers includes an inner-layer conductor layer formed between the first intermediate conductor layer and the first outer conductor layer such that the inner-layer conductor layer has one of the first conductor layer structure and the second conductor layer structure.

14. The wiring substrate according to claim 13, wherein the inner-layer conductor layer has the first conductor layer structure.

15. The wiring substrate according to claim 13, wherein the inner-layer conductor layer has the second conductor layer structure.

16. The wiring substrate according to claim 1, wherein the plurality of second conductor layers includes an inner-layer conductor layer formed between the second inner conductor layer and the second intermediate conductor layer such that the inner-layer conductor layer has one of the first conductor layer structure and the second conductor layer structure.

17. The wiring substrate according to claim 1, wherein the plurality of second conductor layers includes an inner-layer conductor layer formed between the second intermediate conductor layer and the second outer conductor layer such that the inner-layer conductor layer has one of the first conductor layer structure and the second conductor layer structure.

18. The wiring substrate according to claim 1, wherein the plurality of first conductor layers includes a first inner-layer conductor layer formed between the first inner conductor layer and the first intermediate conductor layer, the plurality of second conductor layers includes a second inner-layer conductor layer formed between the second inner conductor layer and the second intermediate conductor layer, and the first and second inner-layer conductor layers have one of the first conductor layer structure and the second conductor layer structure.

19. The wiring substrate according to claim 18, wherein the first and second inner-layer conductor layers have the first conductor layer structure.

20. The wiring substrate according to claim 18, wherein the first and second inner-layer conductor layers have the second conductor layer structure.

* * * * *